US010283214B2

United States Patent
Sato (10) Patent No.: US 10,283,214 B2
(45) Date of Patent: May 7, 2019

(54) SEMICONDUCTOR DEVICE AND SEMICONDUCTOR INTEGRATED SYSTEM (71) Applicant: RENESAS ELECTRONICS CORPORATION, Tokyo (JP)

(72) Inventor: Hajime Sato, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/801,018

(22) Filed: Nov. 1, 2017

(65) Prior Publication Data
US 2018/0151247 A1 May 31, 2018

(30) Foreign Application Priority Data

Nov. 30, 2016 (JP) .................. 2016-232846

(51) Int. Cl.
*G11C 29/00* (2006.01)
*G11C 29/18* (2006.01)
(Continued)

(52) U.S. Cl.
CPC ............ *G11C 29/18* (2013.01); *G11C 11/408* (2013.01); *G11C 11/4076* (2013.01); *G11C 11/4093* (2013.01); *G11C 29/1201* (2013.01); *G11C 29/26* (2013.01); *G11C 29/32* (2013.01); *G11C 29/48* (2013.01); *H01L 25/0652* (2013.01); *H01L 25/0657* (2013.01); *H01L 25/18* (2013.01); *G06F 13/1673* (2013.01); *G11C 2029/0401* (2013.01); *H01L 24/13* (2013.01); *H01L 24/16* (2013.01); *H01L 24/17* (2013.01); *H01L 2224/13025* (2013.01); *H01L 2224/16146* (2013.01); *H01L 2224/16225* (2013.01); *H01L 2224/16227* (2013.01); *H01L 2224/17181* (2013.01); *H01L 2225/06513* (2013.01); *H01L 2225/06517* (2013.01); *H01L 2225/06541* (2013.01); *H01L 2225/06565* (2013.01); *H01L 2225/06586* (2013.01); *H01L 2225/06596* (2013.01); *H01L 2924/1431* (2013.01); *H01L 2924/1434* (2013.01);
(Continued)

(58) Field of Classification Search
CPC .................... G11C 11/4076; G06F 13/1673
USPC ............................................ 365/51; 711/100
See application file for complete search history.

(56) References Cited

U.S. PATENT DOCUMENTS 6,472,747 B2 * 10/2002 Bazarjani ............ H01L 23/3128
257/724
6,711,042 B2 3/2004 Ishikawa
(Continued)

FOREIGN PATENT DOCUMENTS

JP 2003-077296 A 3/2003

*Primary Examiner* — Son Mai
(74) *Attorney, Agent, or Firm* — McDermott Will & Emery LLP (57) ABSTRACT

A semiconductor device is provided where it is possible to access and test a memory chip by a simple method. The semiconductor device that mounts a plurality of chips in a common package includes a logic chip having a predetermined function and a memory chip that is coupled with the logic chip and stores data. The memory chip includes a memory chip testing circuit that performs an operation test of the memory chip and a serial bus interface circuit for transmitting and receiving data between the memory chip testing circuit and a serial bus provided outside the package.

16 Claims, 7 Drawing Sheets

(51) Int. Cl.
  *G11C 11/4076* (2006.01)
  *G11C 11/408* (2006.01)
  *G11C 11/4093* (2006.01)
  *H01L 25/065* (2006.01)
  *H01L 25/18* (2006.01)
  *G11C 29/12* (2006.01)
  *G11C 29/26* (2006.01)
  *G11C 29/32* (2006.01)
  *G11C 29/48* (2006.01)
  *G06F 13/16* (2006.01)
  *G11C 29/04* (2006.01)
  *H01L 23/00* (2006.01)

(52) U.S. Cl.
  CPC ............. *H01L 2924/1436* (2013.01); *H01L 2924/15192* (2013.01); *H01L 2924/15311* (2013.01)

(56) References Cited

U.S. PATENT DOCUMENTS

| | | | | |
|---|---|---|---|---|
| 7,290,186 B1* | 10/2007 | Zorian | ............ | G11C 29/12015 714/718 |
| 8,456,856 B2* | 6/2013 | Lin | ............ | H01L 23/60 257/686 |
| 8,688,892 B2* | 4/2014 | Petersen | ............ | G11C 7/1021 711/100 |
| 9,032,264 B2* | 5/2015 | Hashimoto | ............ | G11C 29/08 714/719 |
| 9,190,173 B2* | 11/2015 | Kobla | ............ | G11C 29/18 |
| 9,298,573 B2* | 3/2016 | Kobla | ............ | G06F 11/27 |
| 9,432,298 B1* | 8/2016 | Smith | ............ | H04L 49/9057 |
| 9,658,971 B2* | 5/2017 | Spence | ............ | G06F 13/1642 |
| 2005/0138267 A1* | 6/2005 | Bains | ............ | G06F 13/1673 711/100 |
| 2008/0201622 A1* | 8/2008 | Hiew | ............ | G11C 29/56 714/718 |
| 2012/0059977 A1* | 3/2012 | Chuang | ............ | G06F 13/1684 711/103 |

\* cited by examiner

SEMICONDUCTOR DEVICE AND SEMICONDUCTOR INTEGRATED SYSTEM

CROSS-REFERENCE TO RELATED APPLICATIONS

The disclosure of Japanese Patent Application No. 2016-232846 filed on Nov. 30, 2016 including the specification, drawings and abstract is incorporated herein by reference in its entirety.

BACKGROUND

The present disclosure relates to a semiconductor device and a semiconductor integrated system and relates to a semiconductor device including a memory chip.

Semiconductor devices called MCP (Multi Chip Package) or MCM (Multi-Chip Module) where a memory chip of large capacity and a logic chip having a specific function such as image processing are mounted in the same package are becoming pervasive.

In this regard, Japanese Unexamined Patent Application Publication No. 2003-77296 proposes an embodiment where a self-test circuit (BIST: Built-In Self-Test circuit) is mounted on a logic chip in an MCP and a test of a memory chip packaged in the same MCP is performed.

However, the embodiment is a method where the logic chip accesses the memory chip, and the embodiment does not disclose a method where the memory chip is directly accessed and the memory chip is tested and debugged.

SUMMARY

On the other hand, a mechanism for directly accessing the memory chip from pins outside the package is required.

The present disclosure is to solve the above problem and an object of the present disclosure is to provide a semiconductor device and a semiconductor integrated system where it is possible to access and test the memory chip by a simple method.

The other problems and novel features will become apparent from the description of the present specification and the accompanying drawings.

According to an embodiment, a semiconductor device that mounts a plurality of chips in a common package includes a logic chip having a predetermined function and a memory chip that is coupled with the logic chip and stores data. The memory chip includes a memory chip testing circuit that performs an operation test of the memory chip and a serial bus interface circuit for transmitting and receiving data between the memory chip testing circuit and a serial bus provided outside the package.

According to the embodiment, the memory chip includes a serial bus interface circuit, so that it is possible to access the memory chip by a simple method.

DETAILED DESCRIPTION

Embodiments will be described in detail with reference to the drawings. The same reference symbols are given to the same or corresponding parts in the drawings, and the description of the parts will not be repeated.

(First Embodiment)

Figure 1:
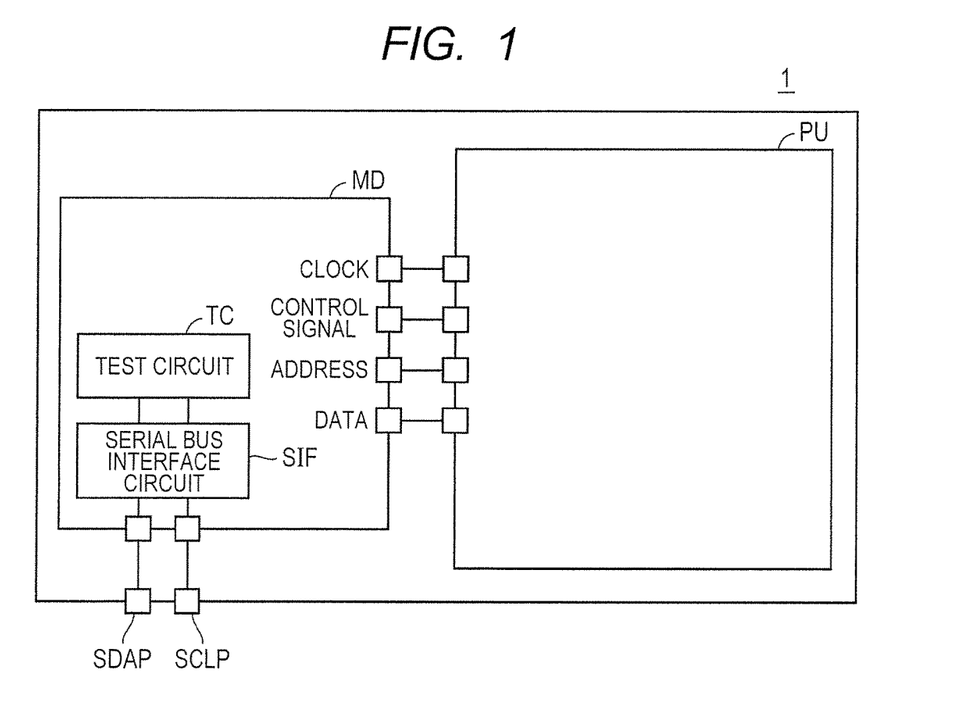
FIG. 1 is a diagram for explaining a configuration of a semiconductor device 1 based on a first embodiment.

FIG. 1 is a diagram for explaining a configuration of a semiconductor device 1 based on a first embodiment.

As shown in FIG. 1, the semiconductor device 1 is a semiconductor device that mounts a plurality of chips in a common package.

Specifically, the semiconductor device 1 includes a logic chip PU and a memory chip MD.

The logic chip PU is a chip such as a processor unit which is incorporated in order to realize a predetermined function.

The memory chip MD is a chip composed of a memory element that stores data.

The logic chip PU is coupled with the memory chip MD and transmits and receives a clock, a control signal, an address, and data to and from the memory chip MD. For example, the memory chip MD operates in synchronization with a clock from the login chip PU. The memory chip MD is accessed according to input of a control signal and an address from the logic chip PU. For example, data is read from the memory chip MD to the logic chip PU, or data is written to the memory chip from the logic chip PU.

In the present example, the memory chip MD is incorporated with a test circuit TC and a serial bus interface circuit SIF.

The memory chip MD includes a DRAM (Dynamic Random Access Memory) element as an example.

The test circuit TC of the semiconductor device 1 includes an external terminal SDAP and an external terminal SCLP through the serial bus interface circuit SIF.

The external terminal SDAP is a data terminal for performing serial data communication. The external terminal SCLP is a clock terminal that specifies timing for performing serial data communication.

The external terminals SDAP and SCLP are coupled with a serial bus provided outside the semiconductor device 1.

In the present example, as the serial bus interface circuit SIF, a standard serial bus interface circuit such as I2C (Inter-Integrated Circuit) is used as an example.

The test circuit TC is a BIST circuit and tests operation and the like of a DRAM element in the memory chip MD.

The semiconductor device 1 based on the first embodiment is mounted with the serial bus interface circuit SIF in the memory chip MD and can issue a test instruction to the test circuit TC through an external serial bus. Further, the semiconductor device 1 can acquire an output result (a test result) from the test circuit TC through the serial bus.

The semiconductor device 1 based on the first embodiment is provided with the external terminals SDAP and SCLP of a standard serial bus such as I2C for accessing the test circuit TC of the memory chip MD. The external terminals SDAP and SCLP are coupled to the standard serial bus.

The memory chip MD of the first embodiment is a stacked type memory chip (a semiconductor storage device), and the semiconductor storage device is provided with the test circuit TC. The test circuit TC is a circuit that performs a test of the DRAM element inside the memory chip MD from a signal of the standard serial bus such as I2C. The test circuit TC is provided so as to be able to be directly controlled through the external terminals SDAP and SCLP. The memory chip MD is controlled by the logic chip PU such as a processor unit in a normal operation. Specifically, the memory chip MD directly communicates with the logic chip PU such as a processor unit by transmitting and receiving a clock, a control signal, an address, and data, and the memory chip MD is not directly accessed from outside. The memory chip MD is used as a cache memory and a packet buffer of a processor unit or the like.

Therefore, it is possible to access the memory chip MD by a simple method by a configuration according to the first embodiment. Although a method for accessing the memory chip MD by using a test pin has been proposed, the method that uses the test pin increases a load of system designer and also increases cost. On the other hand, when using a method that uses an existing serial bus, the system designer can perform a test by a simple method while using the existing bus without introducing any special bus for a new test.

Figure 2:
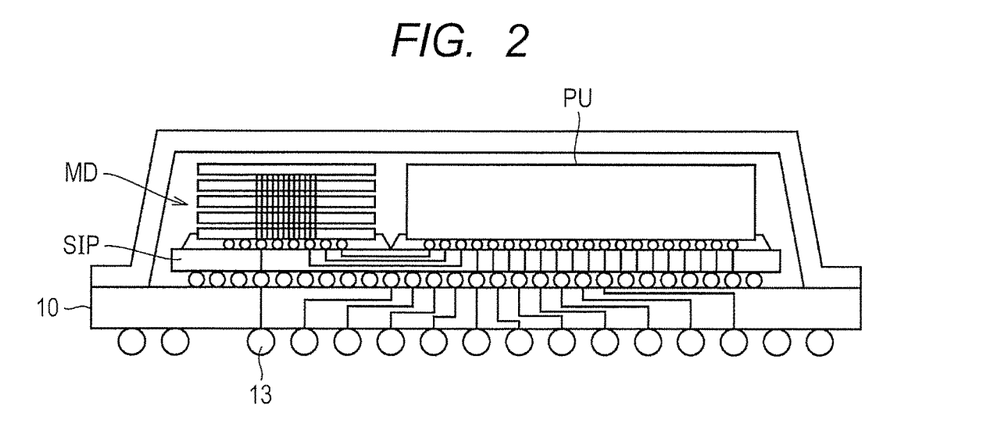
FIG. 2 is a diagram for explaining a cross-sectional structure of the semiconductor device 1 based on the first embodiment.

FIG. 2 is a diagram for explaining a cross-sectional structure of the semiconductor device 1 based on the first embodiment.

As shown in FIG. 2, the memory chip MD is coupled with the logic chip PU through a silicon interposer SIP.

The silicon interposer SIP couples between the memory chip MD and the logic chip PU by ultra-fine wiring.

The silicon interposer SIP is directly electrically coupled with an external package ball 13 through an organic substrate 10. The external package ball 13 functions as an external terminal. In the present example, the external package ball 13 functions as the external terminals SDAP and SCLP.

The memory chip MD is formed of a plurality of stacked type memory dies.

Figure 3:
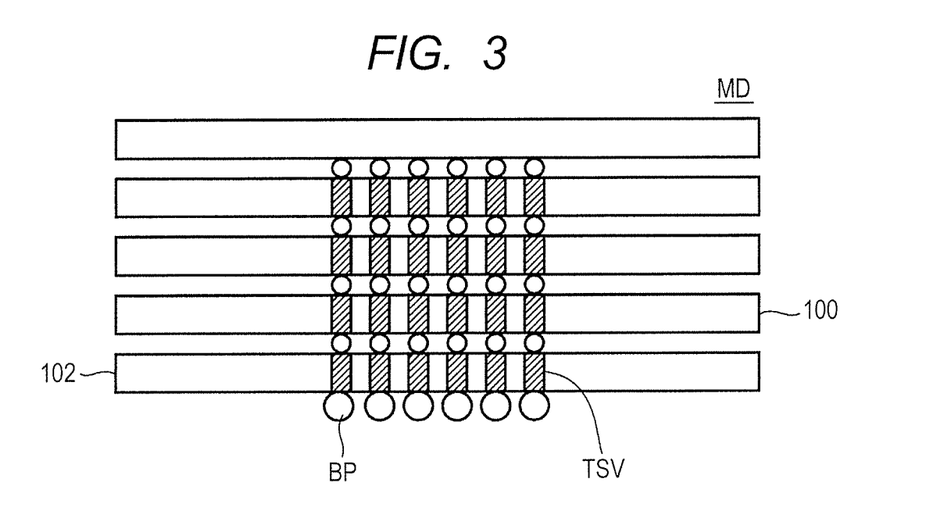
FIG. 3 is a diagram for explaining a configuration of a memory chip MD based on the first embodiment.

FIG. 3 is a diagram for explaining a configuration of the memory chip MD based on the first embodiment.

As shown in FIG. 3, the memory chip MD includes a base die 102 provided at the lowest layer and a plurality of memory dies 100 provided above the base die 102.

The base die 102 and the plurality of memory dies 100 are electrically coupled with each other through a vertical structure through electrode TSV.

The through electrode TSV is electrically coupled with the silicon interposer SIP through a bump BP provided under the base die 102.

Figure 4:
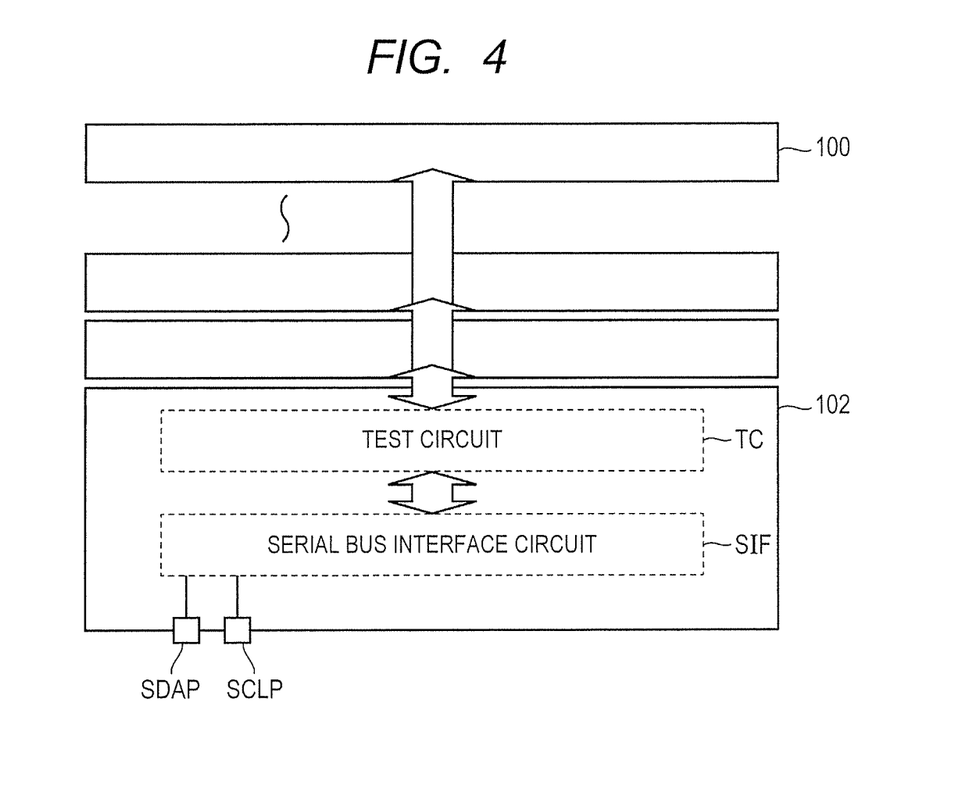
FIG. 4 is a diagram for explaining functional blocks of a base die based on the first embodiment.

FIG. 4 is a diagram for explaining functional blocks of the base die 102 based on the first embodiment.

As shown in FIG. 4, the base die 102 is mounted with the test circuit TC and the serial bus interface circuit SIF.

The serial bus interface circuit SIF is coupled with the external terminal SDAP and the external terminal SCLP.

The test circuit TC is controlled based on data inputted from the external terminal SDAP and the external terminal SCLP through the serial bus interface circuit SIF. A test result from the test circuit TC is outputted to the external terminal SDAP through the serial bus interface circuit SIF.

Figure 5:
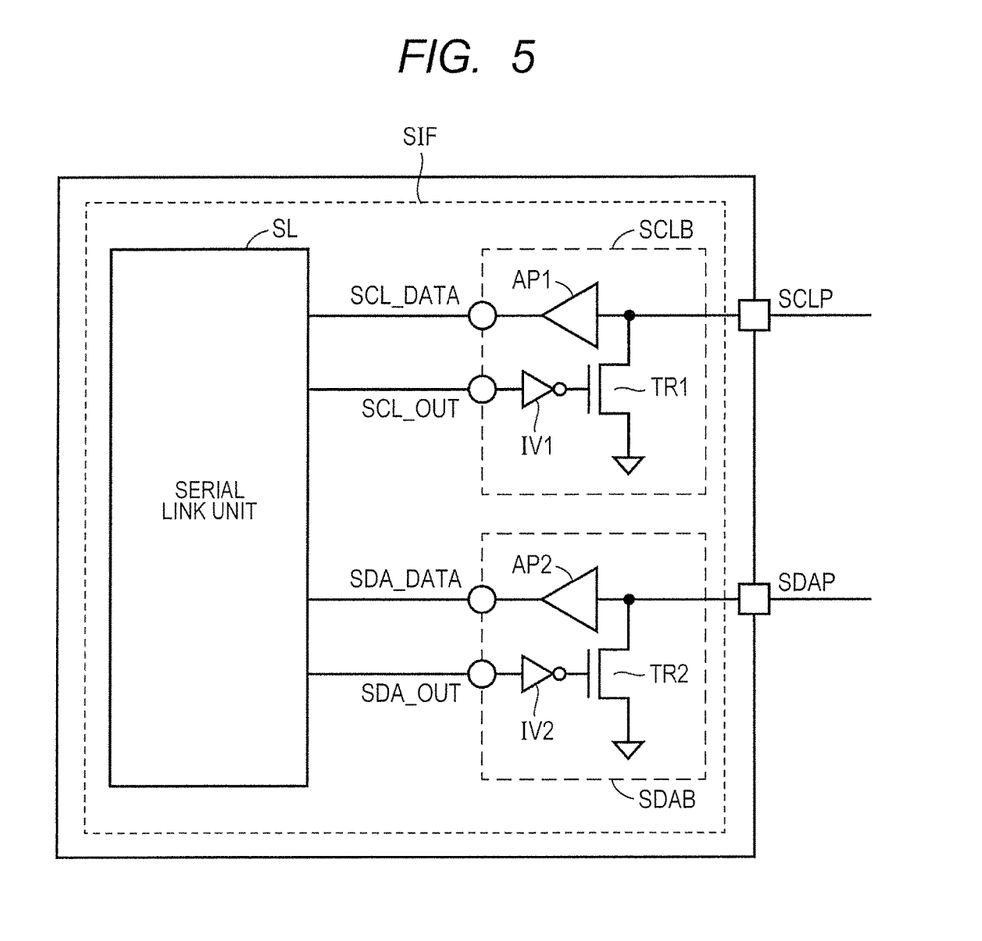
FIG. 5 is a diagram for explaining a configuration of a serial bus interface circuit SIF based on the first embodiment.

FIG. 5 is a diagram for explaining a configuration of the serial bus interface circuit SIF based on the first embodiment.

As shown in FIG. 5, the serial bus interface circuit SIF includes a clock buffer SCLB for a clock signal, a data buffer SDAB for a data signal, and a serial link unit SL.

The serial link unit SL is coupled with the clock buffer SCLB for a clock signal and the data buffer SDAB for a data signal.

The serial link unit SL receives a serial clock and serial data inputted through a serial bus and outputs a test instruction to the test circuit TC. Further, the serial link unit SL receives an output result (a test result) from the test circuit TC and outputs a serial clock and serial data to the serial bus.

The external terminal SCLP is coupled with the clock buffer SCLB. The external terminal SDAP is coupled with the data buffer SDAB.

The clock buffer SCLB includes an amplifier AP1, an inverter IV1, and a transistor TR1.

The data buffer SDAB includes an amplifier AP2, an inverter IV2, and a transistor TR2.

Regarding the serial clock (SCL_DATA and SCL_OUT) and the serial data (SDA_DATA and SDA_OUT), data is transmitted to and received from the serial link unit SL through the clock buffer SCLB and the data buffer SDAB.

A data communication method between the serial link unit SL and the serial bus through the clock buffer SCLB and the data buffer SDAB is generally known, so that the method will not be described in detail. As an example, it is possible to use a communication method of I2C serial bus.

Figure 6:
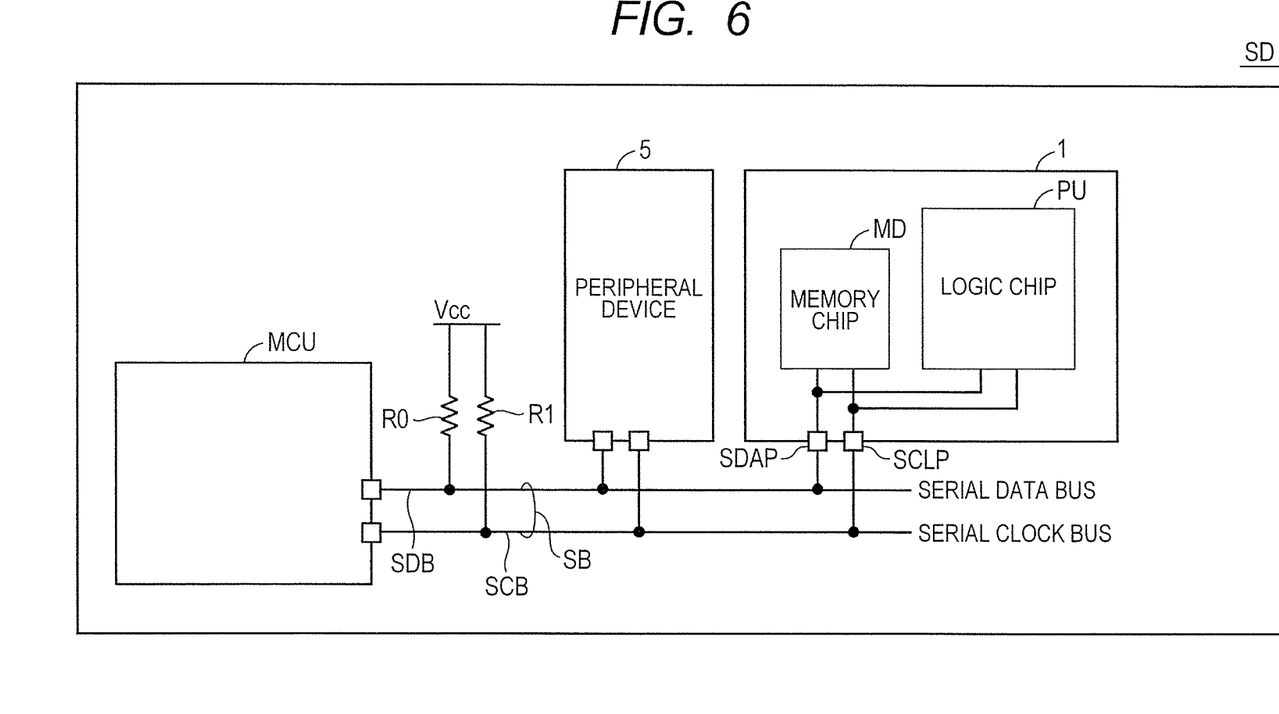
FIG. 6 is a diagram for explaining a configuration of a system board SD based on the first embodiment.

FIG. 6 is a diagram for explaining a configuration of a system board SD based on the first embodiment.

As shown in FIG. 6, over a system board SD (mother board), an entire control unit MCU that controls the entire system board SD, a peripheral device 5, the semiconductor device 1, and a serial bus SB are mounted. As the peripheral device 5, a semiconductor device of various sensors may be mounted as an example. However, the peripheral device 5 is not limited to a sensor.

The entire control unit MCU, the peripheral device 5, and the semiconductor device 1 are coupled through the serial bus SB, and the serial bus SB is pulled up by a power supply voltage VCC through resistance elements R0 and R1. The serial bus SB includes a serial data bus SDB and a serial clock bus SCB. The serial data bus SDB is provided for the serial data. The serial clock bus SCB is provided for the serial clock.

Although not shown in the drawings, the entire control unit MCU, the peripheral device 5, and the semiconductor device 1, each of which are a device, are provided with serial bus interfaces, respectively, and are able to communicate with each other. As an example, it is possible to use a communication method of I2C serial bus.

The entire control unit MCU can access each semiconductor device 1 through the serial bus SB. When performing a test on the memory chip MD according to the embodiment over the system board SD, it is not necessary to introduce a special bus for the memory chip. It is possible to test the memory chip MD by using an existing standard serial bus. Further, the test circuit (BIST circuit) is controlled by using a standard serial bus, so that it is possible to reduce man-hour for developing a test program and debug software.

(Modified Example)

Figure 7:
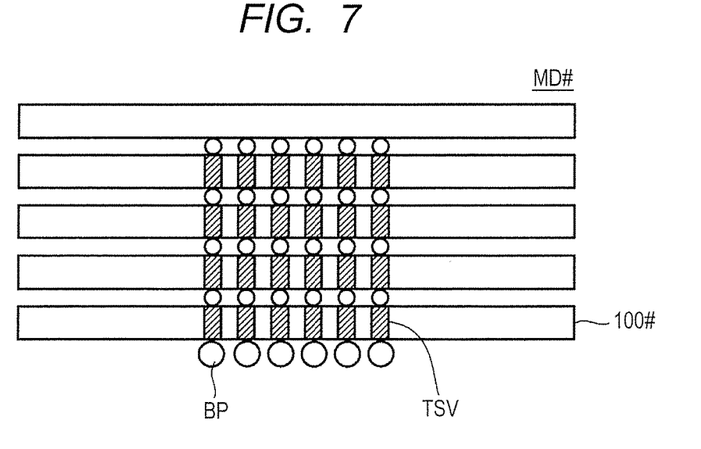
FIG. 7 is a diagram for explaining a configuration of a memory chip MD# based on a modified example of the first embodiment.

FIG. 7 is a diagram for explaining a configuration of a memory chip MD# based on a modified example of the first embodiment.

As shown in FIG. 7, the memory chip MD# includes a plurality of memory dies 100#.

The memory chip MD# is different from the memory chip MD described in FIG. 3 in that the memory chip MD# has no base die.

Specifically, the memory chip MD# is formed of only the plurality of memory dies 100#.

In the same manner as described above, the plurality of memory dies 100# are electrically coupled with each other through the vertical structure through electrode TSV.

The through electrode TSV is electrically coupled with the silicon interposer SIP through the bump BP provided to the lowest memory die 100#.

The lowest memory die 100# is provided with the test circuit TC and the serial bus interface circuit SIF.

The other components are the same as those of the first embodiment, so that the detailed description thereof will not be repeated.

In general, different process nodes are often respectively applied to the base die and the memory die. However, in the modified example of the first embodiment, it is possible to obtain the same effect as that of the first embodiment by only the process node of the memory die, so that it is possible to further reduce the cost.

(Second Embodiment)

Figure 8:
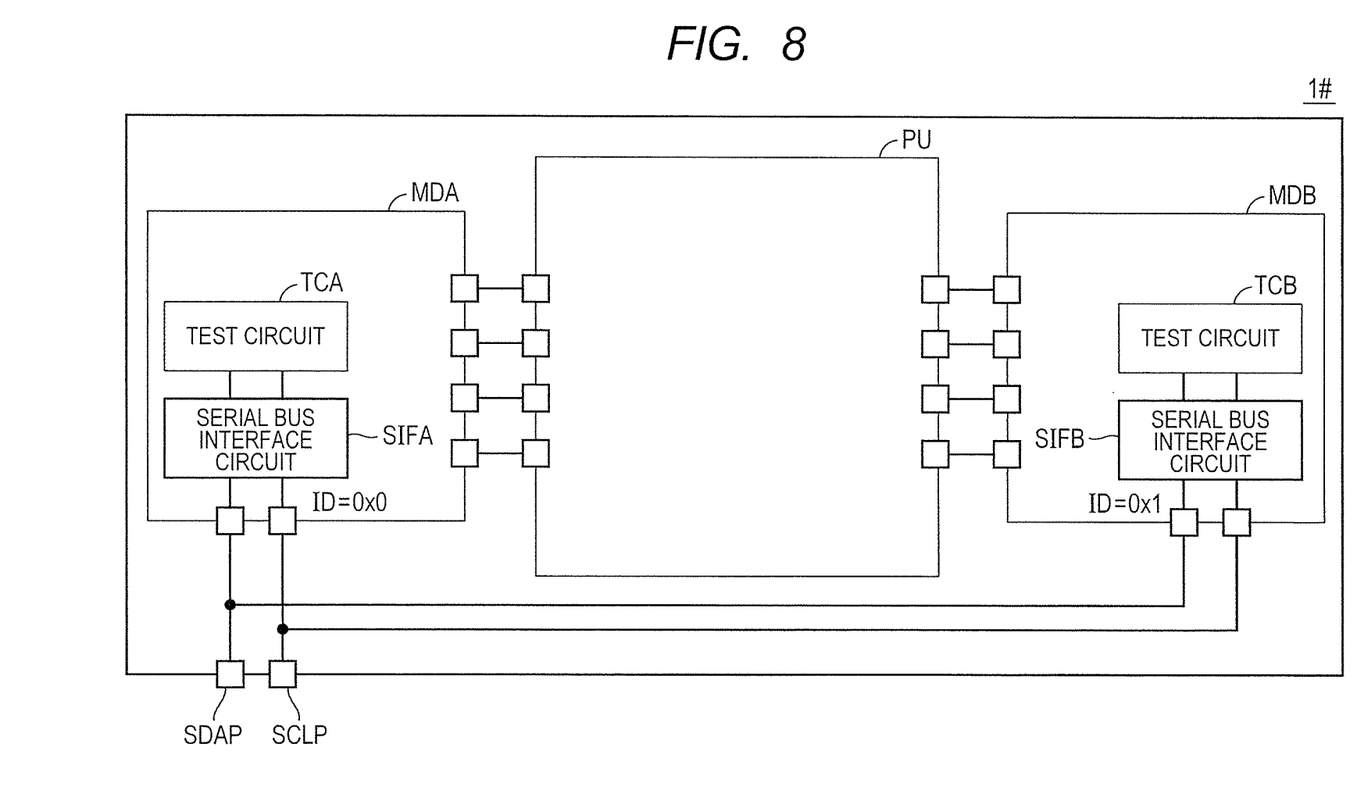
FIG. 8 is a diagram for explaining a configuration of a semiconductor device 1# based on a second embodiment.

FIG. 8 is a diagram for explaining a configuration of a semiconductor device 1# based on a second embodiment.

As shown in FIG. 8, the semiconductor device 1# mounts a plurality of memory chips MDA and MDB and a common logic chip PU in a common package.

Each of the memory chips MDA and MDB is configured to be able to be accessed from the logic chip PU.

The other components are the same as those of FIG. 1, so that the detailed description thereof will not be repeated.

The memory chip MDA includes a test circuit TCA and a serial bus interface circuit SIFA.

The memory chip MDB includes a test circuit TCB and a serial bus interface circuit SIFB.

The test circuits TCA and TCB are basically the same as the test circuit TC.

The serial bus interface circuits SIFA and SIFB are basically the same as the serial bus interface circuit SIF.

The external terminal SDAP and the external terminal SCLP are provided as common terminals of the serial bus interface circuits SIFA and SIFB.

In the present example, a case is shown where identification information is assigned to each of the memory chips MDA and MDB.

Specifically, identification information ID (0×0) is assigned to the memory chip MDA. As an example, a device ID (0×0) of a serial bus is set corresponding to the memory chip MDA. Further, identification information ID (0×1) is assigned to the memory chip MDB. As an example, a device ID (0×1) of a serial bus is set corresponding to the memory chip MDB.

The semiconductor device 1# based on the second embodiment mounts the serial bus interface circuits SIFA and SIFB on the memory chips MDA and MDB, respectively. The serial bus interface circuits SIFA and SIFB receive an input of test instruction inputted through an external serial bus according to identification information assigned to the memory chips MDA and MDB, respectively.

Each of test circuits TCA and TCB performs test according to the test instruction. The test circuits TCA and TCB can output an output result (a test result) through an external serial bus.

By this constitution, it is possible to directly test each memory chip included in the semiconductor device 1# from a system through a serial bus.

Further, in the present example, it is possible to access a plurality of memory chips by using the common external teLutinals SDAP and SCLP. Therefore, even when a plurality of memory chips are mounted in the semiconductor device, it is possible to reduce the number of serial bus terminals required as external teLminals of the semiconductor device to a minimum.

(Third Embodiment)

Figure 9:
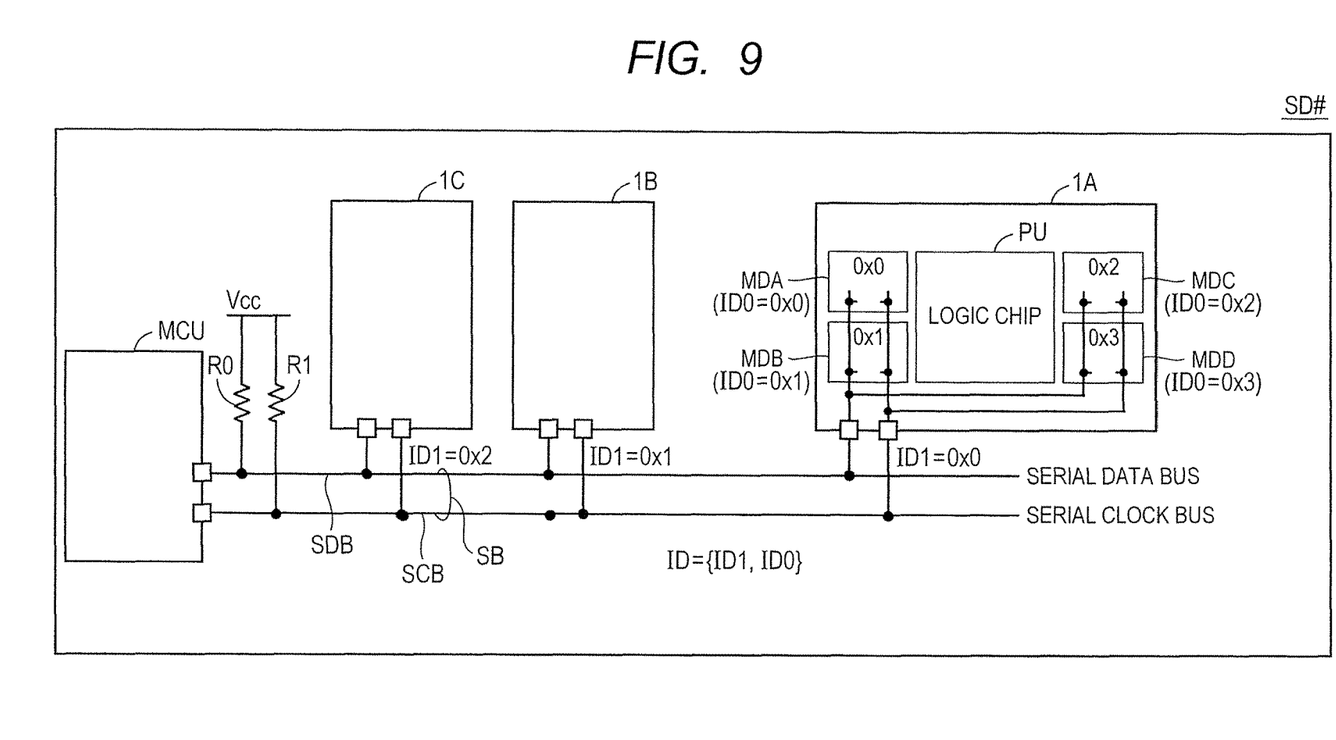
FIG. 9 is a diagram for explaining a configuration of a system board SD# based on a third embodiment.

FIG. 9 is a diagram for explaining a configuration of a system board SD# based on a third embodiment.

As shown in FIG. 9, over a system board SD# (motherboard), an entire control unit MCU that controls the entire system board SD#, a plurality of semiconductor devices 1A to 1C, and a serial bus SB are mounted.

The semiconductor device 1A. mounts a plurality of memory chips MDA, MDB, MDC, and MDD, and a logic chip PU in a common package.

Each of the memory chips MDA, MDB, MDC, and MDD is configured to be able to be accessed from the logic chip PU. The other components are the same as those of FIG. 1, so that the detailed description thereof will not be repeated.

In the present example, a case is shown where identification info Nation is assigned to each of the memory chips MDA to MDD. Further, a case is shown where identification information is also assigned to each of the plurality of semiconductor devices 1A to 1C.

Specifically, a device ID of the serial bus is divided into upper bits and lower bits, and then the upper bits are assigned to a semiconductor device and the lower bits are assigned to the memory chip of the semiconductor device.

As an example, sets of upper bits ID1 of the device ID of the serial bus are assigned corresponding to the semiconductor devices 1A to 1C, respectively. Specifically, the device ID1 (0×0) is set corresponding to the semiconductor device 1A. The device ID1 (0×1) is set corresponding to the semiconductor device 1B. The device ID1 (0×2) is set corresponding to the semiconductor device 1C.

Further, sets of lower bits ID0 of the device ID of the serial bus are assigned corresponding to the memory chips in each semiconductor device 1A to 1C, respectively. Specifically, the device ID0 (0×0) of the serial bus is set corresponding to the memory chip MDA. The device ID0 (0×1) of the serial bus is set corresponding to the memory chip MDB. The device ID0 (0×2) of the serial bus is set corresponding to the memory chip MDC. The device ID0 (0×3) of the serial bus is set corresponding to the memory chip MDD.

Although no peripheral device is provided in the present example, the peripheral device 5 may be further mounted over the system board SD#. The peripheral device 5 is not limited to a sensor.

The entire control unit MCU and the semiconductor devices 1A to 1C are coupled through the serial bus SB, and the serial bus SB is pulled up by the power supply voltage VCC through the resistance elements R0 and R1. Although not shown in the drawings, the entire control unit MCU and the semiconductor devices 1A to 1C, each of which are a device, are provided with serial bus interfaces, respectively, and are able to communicate with each other. As an example, it is possible to use a communication method of I2C serial bus.

The entire control unit MCU can access each semiconductor device 1 through the serial bus SB by using the upper bits of the identification information. Further, the entire control unit MCU can access a corresponding memory chip in the semiconductor device through the serial bus SB by using the lower bits of the identification information.

When performing a test on the memory chip MD according to the embodiment over the system board SD, it is not necessary to introduce a special bus for the memory chip. It is possible to test the memory chip MD by using an existing standard serial bus. Further, the test circuit (BIST circuit) is controlled by using a standard serial bus, so that it is possible to reduce man-hour for developing a test program and debug software.

While the present disclosure has been specifically described based on the embodiments, it is needless to say that the present invention is not limited to the embodiments and may be variously modified without departing from the scope of the invention.

What is claimed is:

1. A semiconductor device, comprising:
a logic chip having a predetermined function; and
a memory chip that is coupled with the logic chip and stores data,
wherein the logic chip and the memory chip are accommodated in a package, and
wherein the memory chip includes:
   a memory chip testing circuit that performs an operation test of the memory chip, and
   a serial bus interface circuit for transmitting and receiving data between the memory chip testing circuit and a serial bus provided outside the package.

2. The semiconductor device according to claim 1,
wherein the memory chip includes memory dies stacked on each other and electrically coupled to each other by a through electrode, and
wherein the memory chip testing circuit and the serial bus interface circuit are provided to at least one of the memory dies.

3. The semiconductor device according to claim 1,
wherein the memory chip includes
   a base die provided at a lowest layer of the memory chip, and
   memory dies stacked on the base die and electrically coupled to each other by a through electrode, and
wherein the memory chip testing circuit and the serial bus interface circuit are provided to the base die.

4. The semiconductor device according to claim 3, wherein the base die further includes a bump that is used for external coupling.

5. The semiconductor device according to claim 1, wherein the logic chip and the memory chip are coupled through a silicon interposer.

6. The semiconductor device according to claim 1,
wherein the serial bus interface circuit includes
a clock buffer for a clock signal, and
a data buffer for a data signal.

7. A semiconductor integrated system comprising:
a system board;
an entire control unit that is provided over the system board and controls the entire system board;
a plurality of semiconductor devices provided over the system board; and
a serial bus that couples the entire control unit and the semiconductor devices,
wherein each semiconductor device is a semiconductor device that mounts a plurality of chips in a common package, and includes
a logic chip having a predetermined function, and
a memory chip that is coupled with the logic chip and stores data, and
wherein the memory chip includes
a memory chip testing circuit that performs an operation test of the memory chip, and
a serial bus interface circuit for transmitting and receiving data between the memory chip testing circuit and the serial bus provided outside the package.

8. The semiconductor integrated system according to claim 7,
wherein identification information is assigned to each of the semiconductor devices, and
wherein the entire control unit accesses a memory chip of a corresponding semiconductor device according to identification information assigned through the serial bus and instructs the memory chip to perform the operation test.

9. The semiconductor integrated system according to claim 8,
wherein each semiconductor device is provided with a plurality of memory chips,
wherein the identification information includes upper bits and lower bits, and
wherein the entire control unit accesses a corresponding semiconductor device of the semiconductor devices based on at least either of the upper bits and the lower bits assigned through the serial bus, accesses a corresponding memory chip of the memory chips in the corresponding semiconductor device based on the other of the upper bits and the lower bits, and instructs the memory chip to perform the operation test.

10. The semiconductor integrated system according to claim 7,
wherein the memory chip includes a plurality of stacked type memory dies which are electrically coupled together by a through electrode, and
wherein the memory chip testing circuit and the serial bus interface circuit are provided to at least one of the memory dies.

11. The semiconductor device according to claim 6,
wherein the serial bus interface circuit further includes a serial link unit coupled with the clock buffer and the data buffer,
wherein the serial link unit receives a serial clock and serial data through the serial bus and outputs a test instruction to the memory chip testing circuit, and
wherein the serial link unit receives a test result from the memory chip testing circuit and outputs a serial clock and serial data based on the test result to the serial bus.

12. The semiconductor device according to claim 5,
wherein the silicon interposer is accommodated in the package.

13. The semiconductor device according to claim 12, further comprising:
a substrate having one surface on which the silicon interposer is mounted, and
wherein an external package ball is provided on another surface of the substrate.

14. A semiconductor device, comprising:
an interposer;
a logic chip having a predetermined function and disposed on the interposer; and
a first memory chip including a first memory die storing data, disposed on the interposer, and coupled with the logic chip through the interposer, wherein the logic chip, the first memory chip, and the interposer are accommodated in a package, and wherein the first memory chip further includes:

a first testing circuit that performs an operation test of the first memory chip, and a first serial bus interface circuit transmitting and receiving data between the first testing circuit and a serial bus provided outside the package, and including a first data terminal for performing serial data communication between the first testing circuit and the serial bus, and a first clock terminal that specifies timing for performing the serial data communication.

15. The semiconductor device according to claim 14, further comprising:

a second memory chip including a second memory die storing data, disposed on the interposer, coupled with the logic chip through the interposer, and accommodated in the package, wherein the second memory chip further includes:

a second testing circuit that performs an operation test of the second memory chip, and a second serial bus interface circuit transmitting and receiving data between the second testing circuit and the serial bus, and including a second data terminal for performing serial data communication between the second testing circuit and the serial bus, and a second clock terminal that specifies timing for performing the serial data communication.

16. The semiconductor device according to claim 15, further comprising an external data terminal coupled to the first data terminal of the first serial bus interface and the second data terminal of the second serial bus interface, and commutating with the serial bus; and an external clock terminal coupled to the first clock terminal of the first serial bus interface and the second clock terminal of the second serial bus interface, and commutating with the serial bus.

* * * * *